United States Patent
Jang

(10) Patent No.: US 6,235,633 B1
(45) Date of Patent: May 22, 2001

(54) METHOD FOR MAKING TUNGSTEN METAL PLUGS IN A POLYMER LOW-K INTERMETAL DIELECTRIC LAYER USING AN IMPROVED TWO-STEP CHEMICAL/ MECHANICAL POLISHING PROCESS

(75) Inventor: Syun-Ming Jang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/290,924

(22) Filed: Apr. 12, 1999

(51) Int. Cl.[7] .................................................. H01L 21/44
(52) U.S. Cl. ........................ 438/675; 438/633; 438/627; 438/637; 438/685; 438/643
(58) Field of Search .................................... 438/675, 685, 438/671–673, 624, 626–629, 631, 633–634, 637–640, 643, 645, 648

(56) References Cited

U.S. PATENT DOCUMENTS

| | | | |
|---|---|---|---|
| 5,244,534 | 9/1993 | Yu et al. ............................... | 156/636 |
| 5,403,779 | 4/1995 | Joshi et al. ............................ | 437/190 |
| 5,573,633 | 11/1996 | Gambino et al. .................. | 156/636.1 |
| 5,614,444 | 3/1997 | Farkas et al. ......................... | 437/225 |
| 5,707,492 | 1/1998 | Stager et al. ....................... | 156/645.1 |
| 5,726,099 | 3/1998 | Jaso ...................................... | 438/693 |
| 5,747,382 | 5/1998 | Huang et al. ......................... | 438/624 |
| 6,043,146 | * 3/2000 | Watanabe et al. ................... | 438/623 |
| 6,069,068 | * 3/2000 | Rathore et al. ...................... | 438/628 |

* cited by examiner

Primary Examiner—Charles Bowers
Assistant Examiner—Thanh Nguyen
(74) Attorney, Agent, or Firm—George O. Saile; Stephen B. Ackerman

(57) ABSTRACT

A novel two-step chem/mech polishing process is described for making tungsten metal plugs in a low-k polymer intermetal dielectric (IMD) layer for ULSI circuits. Since the etch selectivity between the polymer and photoresist is low, a hard mask ($SiO_2$) is used over the low-k IMD layer to allow contact openings to be etched in the low-k polymer. A tungsten metal is deposited and a first polishing step, having a high polishing selectivity of tungsten to $SiO_2$, is used to form tungsten plugs. However, during the etching of the contact openings, erosion of the hard mask at the periphery of the openings is damaged and degrades the IMD, and causes residual metal between the plugs to cause intralevel shorts. To eliminate this problem, a second shorter polishing step, having a low polishing selectivity of tungsten to $SiO_2$, is then used to remove the hard mask and remove any residual metal between adjacent metal plugs.

20 Claims, 3 Drawing Sheets

METHOD FOR MAKING TUNGSTEN METAL PLUGS IN A POLYMER LOW-K INTERMETAL DIELECTRIC LAYER USING AN IMPROVED TWO-STEP CHEMICAL/ MECHANICAL POLISHING PROCESS

BACKGROUND OF THE INVENTION (1) Field of the Invention

The present invention relates to semiconductor manufacturing processing, and more particularly to a chemical/ mechanical polishing (CMP) process for making tungsten metal plugs in low-k (having a low dielectric constant) intermetal dielectric (IMD) layers. The method uses a hard mask and a two-step selective CMP process for making tungsten plugs that are planar with the low-k IMD layer and avoids polishing damage such as erosion and dishing of the IMD layer.

(2) Description of the Prior Art

The packing density of devices on integrated circuits has dramatically increased on ultra-large scale integrated (ULSI) circuits due to advances in semiconductor processing, such as the use of high-resolution photolithography and anisotropic plasma etching. In this sub-micron technology the allowed packing density of devices on an integrated circuit is strongly dependent on the metal interconnection density. As future design rules are more aggressively scaled down, for example, down to 0.18 to 0.1 micrometers (um), more levels of metal are required to effectively interconnect the high density of discrete devices on the chip.

However, as the number of metal levels increases and the topography gets rougher, it becomes increasingly difficult to pattern the metal levels. This results because a shallow depth of focus (DOF) is required when exposing the photoresist, and the rough topography can result in distorted photoresist images. Another problem is that it is difficult to etch sub-micron feature sizes in the metal layers using anisotropic etching without leaving residue in the underlying rough topography that can cause intralevel electrical shorts.

One method of circumventing these problems is to provide a planar surface and to use a damascene process in which contact openings and trench recesses are etched in the insulator. Then a metal is deposited and chem/mech polished back to provide metal plugs in the contact openings and metal interconnections in the recesses. This results in a planar surface for the next level of processing.

To improve the circuit performance by reducing the RC time constant, it is becoming increasing popular to use a low-k (low dielectric) insulator such as low-k polymers which make it difficult to chem/mech polish the overlying metal layers without damaging the polymer. It is also difficult to pattern the low-k polymer using a photoresist mask and oxygen ($O_2$) plasma etching because of the poor etch selectivity between the photoresist and the polymer. Therefore a hard mask, such as silicon oxide ($SiO_2$) or silicon nitride ($Si_3N_4$), is used over the low-k polymer to provide a mask for selective etching. However, when the photoresist and hard mask are used to etch closely spaced contact openings in the low-k polymer, a severe erosion of the photoresist mask leads to a damaged oxide hard mask at the perimeter of the contact openings, which significantly degrades the planarity of the intermetal dielectric (IMD) layer (low-k polymer and hard mask). Then when the metal is deposited and polished back to form metal plugs in the contact openings, residual metal can result between adjacent metal plugs causing intralevel shorts.

Several methods of making these metal plugs in an insulating layer are described in the literature. Yu et al. in U.S. Pat. No. 5,244,534 teach a two-step chem/mech polishing method for making tungsten plugs in an insulating layer such as BPSG oxide. A first polishing step polishes a tungsten metal selectively to an oxide that results in recessed metal plugs in contact openings in the BPSG oxide. A second polishing step polishes the oxide selectively to the tungsten to remove any residual metal and to form an upward-protruding metal plug to provide a better contact for the next level of metal interconnections. Yu et al. do not address forming tungsten plugs in a low-k polymer layer. In Farkas et al., U.S. Pat. No. 5,614,444, a method is described for including an additive to a polishing slurry to increase the selectivity of the metal polishing to the underlying $SiO_2$ layer. Huang et al. in U.S. Pat. No. 5,747,382 teach a method using a chem/mech polish to provide a planar surface, and a second reactive ion etching is used to remove contaminants in seams in the planarized layer that could cause eruptions during subsequent processing. Stager et al. in U.S. Pat. No. 5,707,492 describe a method of applying titanium to a polishing pad that provides a high polishing rate and good polishing uniformity in a polishing process. Jaso in U.S. Pat. No. 5,726,099 describes a method for using a touch-up slurry during chem/mech polishing that polishes the tungsten stud material and the insulating material ($SiO_2$) at a nearly identical removal rate. Gambino et al. in U.S. Pat. No. 5,573,633 teach a method for forming metal plugs in via holes in a planar insulating layer using a thick polysilicon layer as a chem/mech polish stop layer. A short chem/mech polish is then used to remove the polysilicon. Joshi et al. in U.S. Pat. No. 5,403,779 describe a method for forming low resistance (AlCu or Cu) contact plugs having a refractory metal cap. The refractory metal cap protects the plugs while the AlCu or Cu is selectively removed on the remaining wafer surface. The structure is then made planar by chem/ mech polishing or by selective reactive ion etching the refractory metal cap.

There is still a need in the semiconductor industry to provide an improved chem/mech polishing process that forms tungsten plugs in a low-k polymer insulating layer without dishing and corrosion of the surface of the low-k layer, while avoiding intralevel shorts between closely spaced tungsten plugs in via holes.

SUMMARY OF THE INVENTION

It is a principal object of this invention to provide a method for making tungsten plugs in a polymer intermetal dielectric (IMD) layer using an improved two-step chemical/ mechanical polishing (CMP) process.

It is another object of this invention to provide a two-step CMP process, wherein the first CMP step polishes back a tungsten layer to form tungsten plugs, and the second CMP step is used to selectively removes a damaged silicon oxide ($SiO_2$) hard mask over the IMD layer to prevent via-to-via shorts.

The method for making reliable metal plugs in a low-k (low dielectric) intermetal dielectric (IMD) layer on a semiconductor substrate using an oxide hard mask and a two-step CMP process is now described. The method uses a first chem/mech polishing to minimize surface dishing and corrosion of the IMD layer, and a second chem/mech polishing is used to remove the hard mask and improves the planarity and minimizes electrical shorts between adjacent metal plugs. Although the method is described for making metal plugs in contact openings to an underlying conducting layer, such as to one of the metal interconnections, it should be understood that the method can also be used to make metal plugs in contact openings to the substrate and to patterned polysilicon layers that form portions of devices, such as field effect transistors (FETs), bit lines, and the like.

The method for making metal plugs in a low-k IMD layer by a two-step chemical/mechanical polishing process begins by providing a semiconductor substrate having a planar insulating layer over devices on the substrate. A conducting layer, such as Ti—TiN/AlCu/Ti—TIN, is deposited and patterned to form electrical interconnections. A planar intermetal dielectric layer, more specifically a low-k polymer layer, is deposited by spin coating over the electrical interconnections. Next, a hard mask layer, such as a plasma-enhanced chemical-vapor-deposited (PECVD) silicon oxide ($SiO_2$) using tetraethosiloxane (TEOS) is deposited over the low-k polymer layer, and is referred to as PETEOS oxide. Contact openings (via holes) are etched in the hard mask layer and the low-k polymer layer to the electrical interconnections. A conformal barrier layer, such as Ti/TiN is deposited on the hard mask layer and in the contact openings. A metal layer, such as tungsten (W), is then deposited on the barrier layer and is sufficiently thick to fill the contact openings and to form an essentially planar surface. A first chem/mech polishing is used to polish the tungsten layer and the Ti/TiN barrier layer to the hard mask layer to form tungsten metal plugs in the contact openings. The polishing parameters for the first chem/mech polishing are selected to provide a high polish selectivity of tungsten to the PETEOS CVD oxide hard mask to minimize dishing and corrosion. A second, shorter chemical/mechanical polishing step is carried out using polishing parameters that provide nonselective polishing of tungsten to the PETEOS oxide hard mask. Because of this short polishing, the hard mask is removed without significant dishing, and any metal residue between the metal plugs is removed thereby minimizing electrical shorts and improving reliability.

BRIEF DESCRIPTION OF THE DRAWINGS

The objects and other advantages of this invention are best understood with reference to the preferred embodiment when read in conjunction with the following drawings.

DESCRIPTION OF THE PREFERRED EMBODIMENT

The present invention relates to a method for forming metal plugs in a low-k polymer intermetal dielectric (IMD) layer using a hard mask composed of $SiO_2$, $Si_3N_4$, or silicon oxynitride (SiON) and two chem/mech polishing steps. Although the method is described for a single metal plug contact in an IMD layer, it should be well understood by those skilled in the art that the process can be repeated to complete the multilevel interconnections on an integrated circuit.

Figure 1:
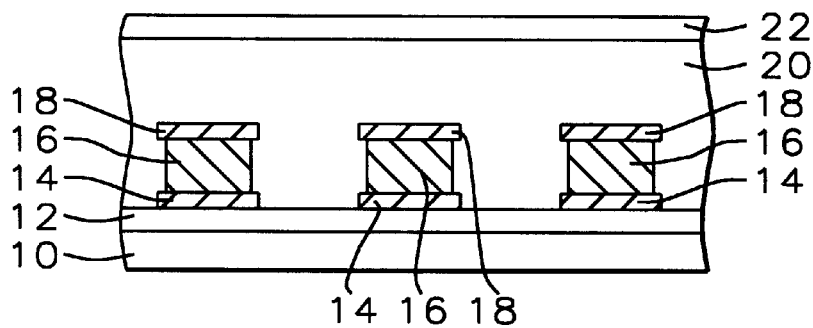
FIGS. 1 through 6 are schematic cross-sectional views showing the sequence of process steps, by the method of this invention, for making metal plug contacts in a low-k polymer intermetal dielectric layer by a two-step chem/mech polishing process using a hard mask.

Referring now to FIG. 1, the method for making these improved metal plugs in a low-K IMD using a two-step chemical/mechanical polishing process and a hard mask begins by providing a semiconductor substrate 10. Typically the substrate is composed of a single-crystal silicon and has semiconductor devices formed therein, such as field effect transistors (FETs), bipolars, and the like, which are not explicitly shown in the drawings. An insulating layer 12 is deposited to electrically insulate the devices on the substrate 10. Typically the insulating layer is a silicon oxide and is planarized, for example by chemical/mechanical polishing. The next level of electrical interconnections is formed by depositing a barrier/adhesion layer 14, such as Ti/TiN, a low resistance metal layer such as Al/cu alloy 16, and an upper barrier layer 18, such as Ti/TiN that also serves as an antireflective coating (ARC) layer. Typically the Ti/TiN layers 14 and 18 are deposited to a thickness of between about 200 and 500 Angstroms, and the metal layer 16 is deposited to a thickness of between about 3500 and 6000 Angstroms. The multilayer (14, 16, and 18) are then patterned by conventional photolithographic techniques and anisotropic plasma etching to form metal interconnections, as shown in FIG. 1.

Still referring to FIG. 1, a planar intermetal dielectric (IMD) layer 20 is deposited. For high-density integrated circuits with sub-micron feature sizes, it is preferable to use a low-k polymer layer which is deposited by spin coating over the electrical interconnections. The preferred polymer is a poly(arylene ether). The polymer IMD layer 20 is deposited to a preferred thickness of between about 18000 and 22000 Angstroms, and is chem/mech polished back to a thickness of between about 7000 and 9000 Angstroms.

Next, a hard mask layer 22, preferably a $SiO_2$, is deposited over the polymer IMD layer 20. Layer 22 is deposited at low temperature by PECVD using a reactant gas such as TEOS. The hard mask layer 22 is deposited to a thickness of between about 1000 and 2000 Angstroms. Alternatively, the hard mask layer 22 can be composed of $Si_3N_4$ or SiON.

Figure 2:
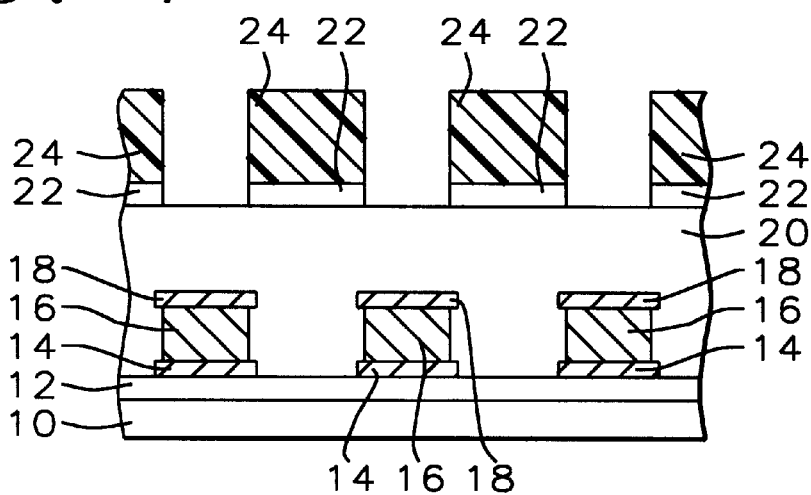

Referring to FIG. 2, a photoresist mask 24 and anisotropic plasma etching are used to etch contact openings (via holes) 2 in the hard mask layer 22 aligned over the underlying metal interconnections formed from layers 14, 16, and 18. Preferably the hard mask layer 22 is etched using high-density-plasma (HDP) etching and an etchant gas mixture consisting of $CHF_3$ at a flow rate of 40 standard cubic centimeters per minute (sccm), $CF_4$ at a flow rate of 20 sccm, Ar at a flow rate of 100 sccm, and $N_2$ at a flow rate of 10 sccm. The etching is carried out in the etching chamber at the above flow rates and at a pressure of 20 milliTorr and at an RF power of 1000 Watts with an RF bias on the substrate of 250 Watts.

Figure 3:
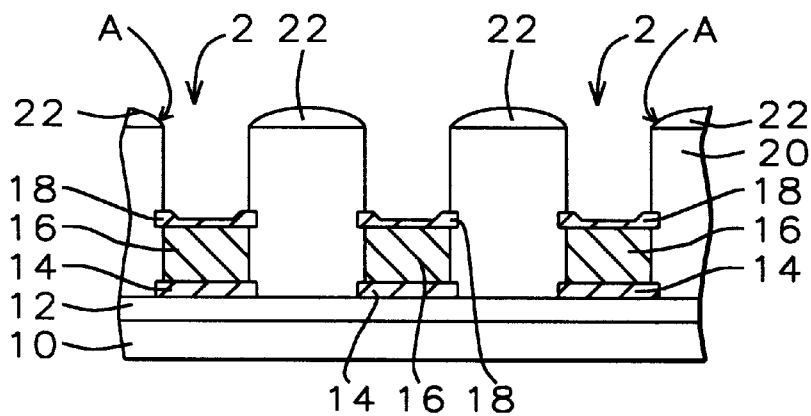

Referring to FIG. 3, the remaining photoresist mask 24 and the hard mask 22 are then used to continue etching the contact openings 2 in the low-k polymer layer 20 to the electrical interconnections. The low-k polymer layer 20 is preferably etched using a HDP etcher and an etchant gas mixture of $O_2$ at a flow rate of 20 sccm in a carrier gas of Ar at a flow rate of 20 sccm. The etching is carried out in the etching chamber at a pressure of 15 milliTorr and at an RF power of 1000 Watts with an RF bias on the substrate of 500 Watts. However, because of the low etch-rate selectivity between the photoresist mask 24 and the low-k polymer (poly(arylene ether)) 20, the severe photoresist loss results in damage (erosion) to the $SiO_2$ hard mask 22 at the perimeter of the contact openings 2, as depicted by the points A in FIG. 3.

Figure 4:
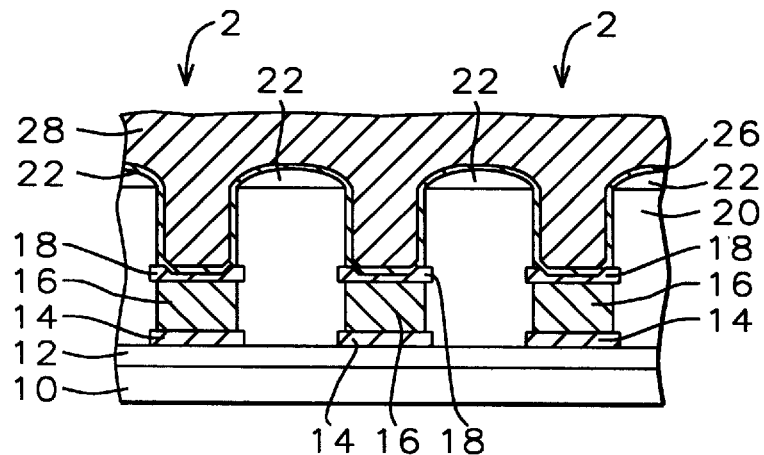

Referring to FIG. 4 and continuing with the process, a conformal barrier layer 26 is deposited on the hard mask layer 24 and in the contact openings 2. Layer 26 is preferably titanium/titanium nitride (Ti/TiN). The Ti is deposited preferably by chemical vapor deposition using, for example, a reactant gas such as titanium tetrachloride (TiCl$_4$), and is deposited to a thickness of between about 100 and 300 Angstroms. Alternatively, the Ti can be deposited by physical vapor deposition (PVD), such as by sputter deposition from a Ti target. When the Ti is deposited by PVD, a nitrogen reactant gas can be introduced after the Ti deposition to deposit a TiN layer on the Ti. The TiN is deposited to a thickness of between about 100 and 200 Angstroms. Alternatively, the TiN can be formed by CVD.

Still referring to FIG. 4, a metal layer 28 is deposited over the Ti/TiN barrier layer 26 and is sufficiently thick to fill the contact openings 2, and more specifically to a thickness of between about 3000 and 5000 Angstroms. Layer 28 is preferably a refractory metal such as tungsten (W). However, other metals can also be used. The tungsten layer 28 is deposited by CVD using a reactant gas mixture such as tungsten hexafluoride (WF$_6$), H$_2$, N$_2$, and Ar. For example, the tungsten layer 28 can be deposited using a commercially available system such as an AMAT tungsten CVD tool, manufactured by Applied Materials Corporation of U.S.A. The tungsten deposition is carried out at a temperature of 475° C. using WF$_6$ at a flow rate of 75 sccm with, H$_2$ at a flow rate of 500 sccm, N$_2$ at a flow rate of 300 sccm, and Ar at a flow rate of 2400 sccm, and at a pressure of 80 Torr.

Figure 5:
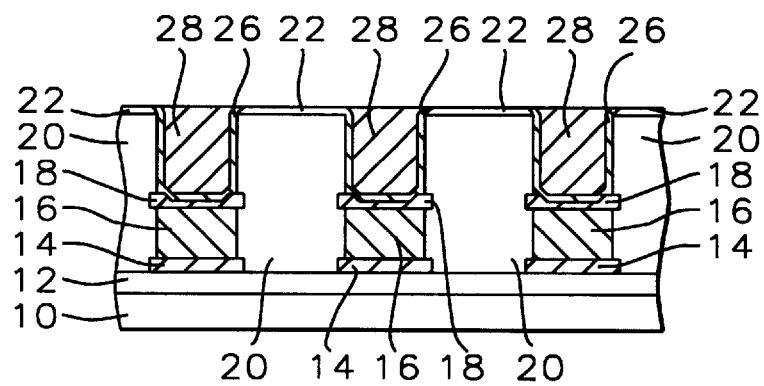

Referring now to FIG. 5 and by the method of this invention, a first chem/mech polishing step is carried out to polish the tungsten layer 28 and the Ti/TiN barrier layer 26 to the hard mask layer 22 to form tungsten metal plugs 28 in the contact openings 2. The polishing parameters for the first chem/mech polishing step are selected to provide a high polishing selectivity of tungsten and the barrier layer 26 to the PETEOS oxide hard 22 mask to minimize dishing and corrosion of the substrate surface, in particular the low-k polymer 20. To achieve a high tungsten-to-oxide selectivity, the polishing pressure, the platen speed, and/or the slurry composition and pad characteristics can be adjusted for the polishing tool. The polishing selectivity of tungsten to PETEOS oxide hard mask is preferably greater than between about 100:1 and 150:1. The high-selectivity polishing can be achieved using commercially available equipment, for example, an Avanti Model 472 or Avanti Model 372M can be used with a slurry such as W-A355 available from Rippey Company of U.S.A., and using a pad type of IC1000/SUBA IV available from Rodel Company of U.S.A. The polishing is carried out at a pressure of 5.0+/−1 pounds per square inch (psi) at a speed of 40+/−4 rpm, a back pressure of 1 to 4 psi, a platen speed of 50+/−4 rpm. At these conditions the removal rate of tungsten is greater than 4500 Angstroms per minute, the non-uniformity is less than 10% across a 200-millimeter (mm) wafer, and the tungsten-to-TEOS-oxide removal rate ratio is greater than 500:1.

Figure 6:
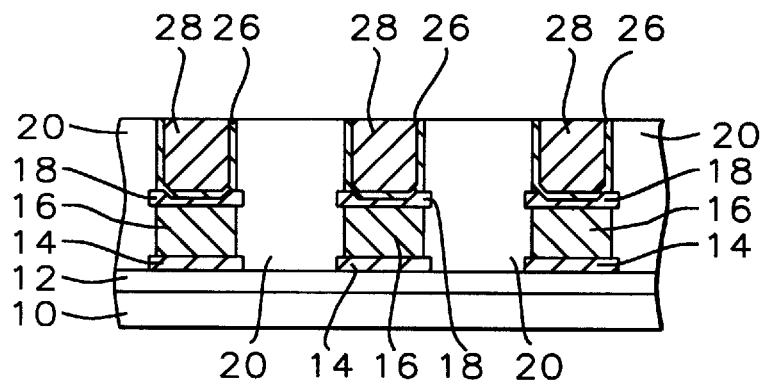

Referring to FIG. 6, a second, shorter chemical/mechanical polishing step is carried out next using polishing parameters that provide non-selective polishing of the tungsten 28 and the barrier layer 26 to the PETEOS oxide hard mask 22. Because of this short polishing step, the hard mask is removed without significant dishing, and any metal residue between the metal plugs is removed thereby minimizing electrical shorts and improving reliability. The polishing parameters for the second chem/mech polishing step are selected to provide a non-selective polishing rate of the tungsten 28 and the barrier layer 26 to the PETEOS oxide hard 22 mask to remove the hard mask 22. This short polishing step also minimizes dishing and corrosion of the substrate surface, in particular the low-k polymer 20. To achieve this non-selective polishing, the polishing pressure, the platen speed, and/or the slurry composition and pad characteristics can be adjusted for the polishing tool. The polishing selectivity between the tungsten and PETEOS oxide hard mask is ideally 1:1, but is at least less than about 25:1. The non-selective polishing can be achieved using commercially available equipment, for example, an Avanti Model 472 or Avanti Model 372M can be used with a slurry such as MSW1000 available from Rodel Company of U.S.A., and using a pad type of SUBA 500 available from Rodel Company of U.S.A. The polishing is carried out at a pressure of 7.0+/−1 psi, at wafer carrier speed of 40+/−4 rpm, a back pressure of 0 psi, a platen speed of 50+/−4 rpm. At these conditions the removal rate of tungsten is greater than 1500 Angstroms per minute, the non-uniformity is less than 5% across a 200-mm wafer, and the tungsten-to-PETEOS-oxide removal rate ratio is about 20:1.

Figure 7:
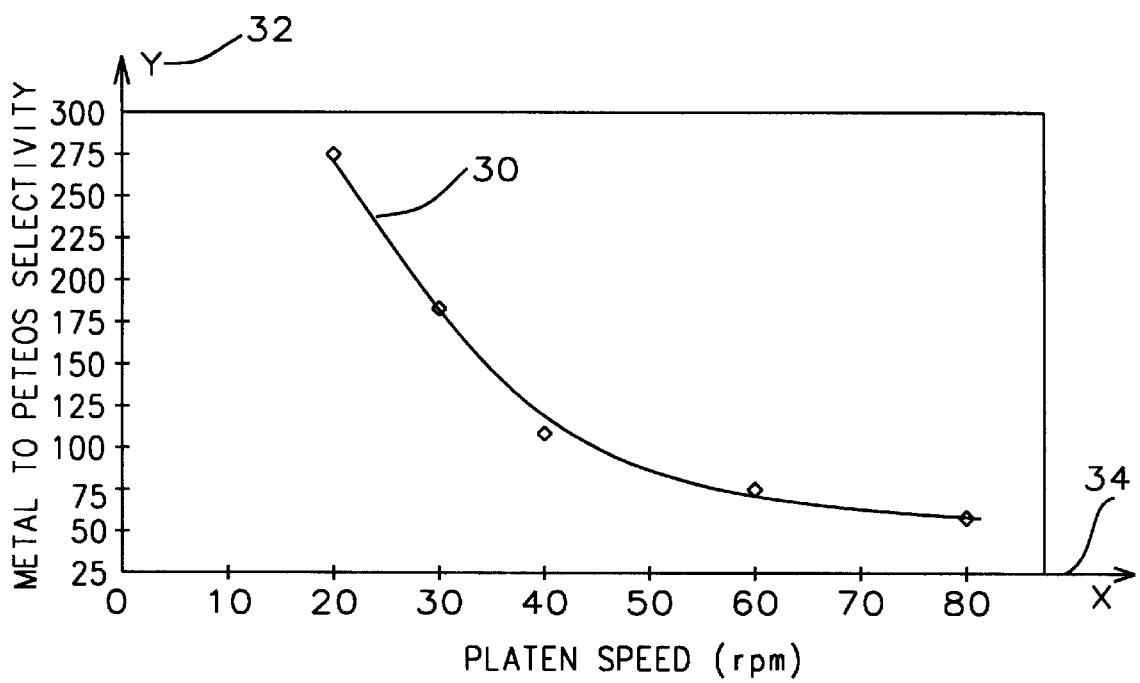
FIG. 7 is a plot from the prior art of the selective polishing rates of a metal to plasma-enhanced tetraethosiloxane (PETEOS) oxide as a function of platen speed (rpm).
Figure 8:
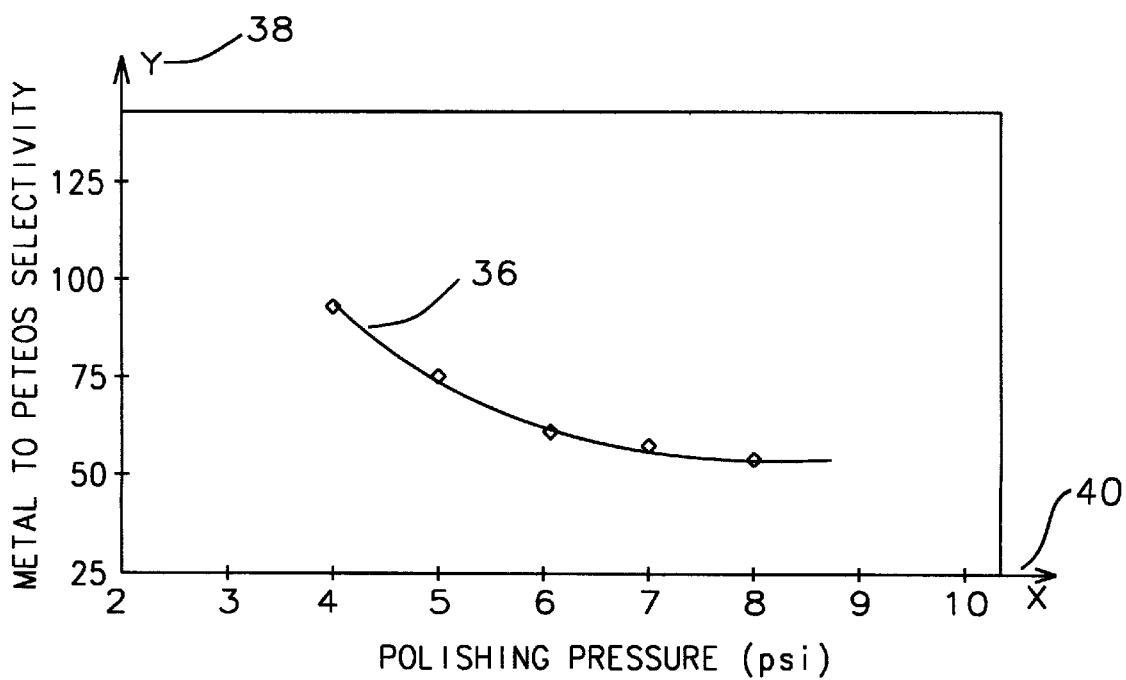
FIG. 8 is a plot from the prior art of the selective polishing rates of a metal to PETEOS oxide as a function of polishing pressure (psi).

Referring to FIGS. 7 and 8, a typical polishing selectivity of a metal to a PETEOS oxide, such as hard mask 22, can be adjusted (fine tuned) to optimize the processing parameters. In FIG. 7 the curve 30 shows the etch-rate ratio of the metal polishing to the PETEOS-oxide polishing along the Y axis 32 as a function of the platen speed in rpm along the X axis 34. By increasing the platen speed, the polishing-rate ratio can be decreased. In FIG. 8 the curve 36 shows the polish-rate ratio of a metal polishing to the PETEOS-oxide polishing along the Y axis 38 as a function of the polishing pressure in psi along the X axis 40. By increasing the polishing pressure, the polishing-rate ratio can be decreased to optimize the polishing process for the second chem/mech polishing step.

While the invention has been particularly shown and described with reference to the preferred embodiment thereof, it will be understood by those skilled in the art that various changes in form and detail may be made without departing from the spirit and scope of the invention.

What is claimed is:

1. A method for making metal plugs in an intermetal dielectric layer comprising the steps of:

providing a semiconductor substrate having semiconductor devices and a planar insulating layer on surface of said substrate;

depositing a conducting layer on said planar insulating layer;

patterning said conducting layer to form electrical interconnections for said semiconductor devices;

depositing a planar intermetal dielectric layer over said electrical interconnections;

depositing a hard mask layer on said intermetal dielectric layer;

etching contact openings in said hard mask layer and said intermetal dielectric layer to said electrical interconnections;

depositing a conformal barrier layer on said hard mask layer and in said contact openings;

depositing a metal layer sufficiently thick to fill said contact openings and to form an planar surface;

forming metal plugs in said contact openings by a first chemical/mechanical polishing of said metal layer and said barrier layer selectively to said hard mask;

using a second chemical/mechanical polishing to remove said hard mask layer and polishing said metal plugs at a comparable polishing rate and thereby minimizing electrical shorts between adjacent said metal plugs.

2. The method of claim 1, wherein said conducting layer is a multilayer composed of a lower titanium/titanium nitride layer, an aluminum/copper alloy, and an upper titanium/titanium nitride layer, where said titanium/nitride layers are barrier/adhesion layers.

3. The method of claim 1, wherein said intermetal dielectric layer is a polymer, and has a thickness of between about 7000 and 9000 Angstroms.

4. The method of claim 3, wherein said polymer is a poly(arylene ether).

5. The method of claim 1, wherein said hard mask layer is silicon oxide deposited by plasma-enhanced chemical vapor deposition (PECVD).

6. The method of claim 1, wherein said hard mask layer is deposited to a thickness of between about 1000 and 2000 Angstroms.

7. The method of claim 1, wherein said barrier layer is a multilayer of titanium and titanium nitride and is deposited to a total thickness of between about 200 and 500 Angstroms.

8. The method of claim 1, wherein said metal layer is tungsten and is deposited to a thickness of between about 3500 and 6000 Angstroms.

9. The method of claim 1, wherein said first chemical/mechanical polishing is carried out having a polishing selectivity of metal to PECVD oxide of at least greater than 100:1.

10. The method of claim 1, wherein said second chemical/mechanical polishing is carried out and has a polishing selectivity of metal to PECVD oxide of at least less than 25:1.

11. A method for making metal plugs in an intermetal dielectric layer comprising the steps of:

providing a semiconductor substrate having semiconductor devices and a planar insulating layer on surface of said substrate;

depositing a conducting layer on said planar insulating layer;

patterning said conducting layer to form electrical interconnections for said semiconductor devices;

depositing a planar intermetal dielectric layer composed of polymer over said electrical interconnections;

depositing a hard mask layer on said intermetal dielectric layer;

etching contact openings in said hard mask layer and said intermetal dielectric,layer to said electrical interconnections;

depositing a conformal barrier layer on said hard mask layer and in said contact openings;

depositing a tungsten metal layer sufficiently thick to fill said contact openings and to form an planar surface;

forming tungsten metal plugs in said contact openings by a first chemical/mechanical polishing of said tungsten metal layer and said barrier layer selectively to said hard mask;

using a second chemical/mechanical polishing to remove said hard mask layer and polishing said tungsten metal plugs at a comparable polishing rate and thereby minimizing electrical shorts between adjacent said metal plugs.

12. The method of claim 11, wherein said conducting layer is a multilayer composed of a lower titanium/titanium nitride layer, an aluminum/copper alloy, and an upper titanium/titanium nitride layer, where said titanium/nitride layers are barrier/adhesion layers.

13. The method of claim 11, wherein said intermetal dielectric layer and has a thickness of between about 7000 and 9000 Angstroms.

14. The method of claim 11, wherein said polymer is a poly(arylene ether).

15. The method of claim 11, wherein said hard mask layer is silicon oxide deposited by plasma-enhanced chemical vapor deposition (PECVD).

16. The method of claim 11, wherein said hard mask layer is deposited to a thickness of between about 1000 and 2000 Angstroms.

17. The method of claim 11, wherein said barrier layer is a multilayer of titanium and titanium nitride and is deposited to a total thickness of between about 200 and 500 Angstroms.

18. The method of claim 11, wherein said tungsten metal layer is deposited to a thickness of between about 3500 and 6000 Angstroms.

19. The method of claim 11, wherein said first chemical/mechanical polishing is carried out having a polishing selectivity of tungsten to PECVD oxide of at least greater than 100:1.

20. The method of claim 1, wherein said second chemical/mechanical polishing is carried out and has a polishing selectivity of tungsten metal to PECVD oxide of at least less than 25:1.

* * * * *